United States Patent [19]

Nagano

[11] Patent Number: 4,510,486
[45] Date of Patent: Apr. 9, 1985

[54] DIGITAL-TO-ANALOG CONVERTER

[75] Inventor: Katsumi Nagano, Hiratsuka, Japan

[73] Assignee: Tokyo Shibaura Denki Kabushiki Kaisha, Japan

[21] Appl. No.: 372,009

[22] Filed: Apr. 26, 1982

[30] Foreign Application Priority Data

Apr. 25, 1981 [JP] Japan .................................. 56-63007

[51] Int. Cl.³ .......................................... H03K 13/02
[52] U.S. Cl. ................................ 340/347 DA; 357/92
[58] Field of Search .................... 340/347 DA; 357/92

[56] References Cited

U.S. PATENT DOCUMENTS 4,178,584 12/1979 Davis .................................. 340/347
4,266,150 5/1981 Bergmann ............................ 357/92
4,323,794 4/1982 Hoehn .................................. 357/92

OTHER PUBLICATIONS

Dao, "IEEE Journal of Solid-State Circuits", vol. SC-12, No. 5, Oct. 1977, pp. 463–472.

*Primary Examiner*—Charles D. Miller
*Attorney, Agent, or Firm*—Finnegan, Henderson, Farabow, Garrett & Dunner

[57] ABSTRACT

A digital-to-analog converter is disclosed which has a plurality of integrated injector logic (I²L) stages each of which receives a single bit of an input digital signal. The output or inverter transistor of each I²L stage has a number of collector electrodes arranged to weight the output of each stage in accordance with the significance of the digital bits supplied thereto. The output signals from each respective I²L stage are combined to produce an analog output signal. Additional α- and β-adjusting circuits are incorporated in each stage to add stability to the D/A converter.

3 Claims, 7 Drawing Figures

4,510,486

DIGITAL-TO-ANALOG CONVERTER

BACKGROUND OF THE INVENTION (1) Field of the Invention

This invention relates generally to digital-to-analog converter circuitry and particularly to a digital-to-analog (D/A) converter which uses integrated-injection-logic (I²L).

(2) Description of the Prior Art

Digital-to-analog converters are common in the prior art. Integrated injection logic (I²L) circuitry is also known in the art and used in applications where increased density of circuitry is desirable.

In the prior art D/A converter circuits often have had problems of stability. Further, such circuits required stabilization by use of capacitances to prevent oscillation. Such a requirement decreases the density of integration insofar as capacitances require larger areas in circuit integration.

SUMMARY OF THE INVENTION

It is an object of this invention to produce a simplified D/A converter of high stabilization and accuracy. The present invention is a D/A converter used to convert input digital signals comprised of a plurality of bits to an output analog signal. The D/A converter includes a plurality of integrated injection logic (I²L) circuits, each having an output transistor with an emitter electrode, base electrode and a plurality of collector electrodes, a constant current source connected to the base electrode of the output or inverter transistor, a reference voltage being applied to the emitter electrode of the inverter transistor and one of the plurality of collector electrodes being connected to the base electrode of the inverter transistor. Each bit of the input digital signal is applied to the base electrode of the inverter transistor of a respective I²L circuit and the output collector terminals of the respective I²L circuits are connected together for producing an output analog signal.

DESCRIPTION OF THE PREFERRED EMBODIMENT

Figure 1:
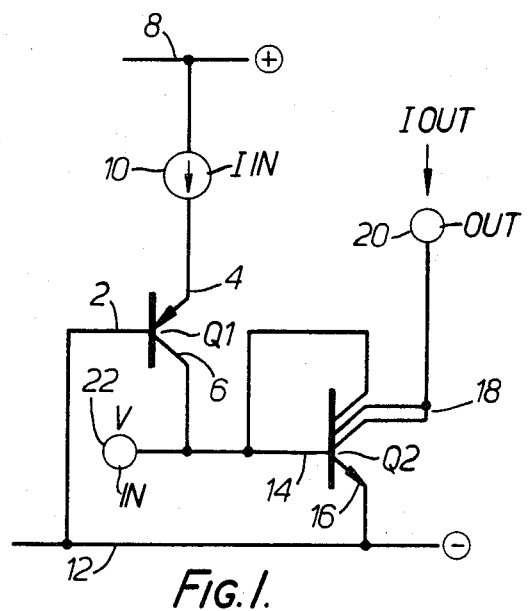
FIG. 1 shows a basic I²L circuit used in the present invention.

Referring now to FIG. 1 there is shown a basic I²L circuit which is configured to be used in the D/A circuit of the present invention. The I²L circuit consists of two transistors, namely a PNP type lateral transistor Q1 and a NPN type vertical transistor Q2. Transistor Q1 acts as an injector transistor and transistor Q2 acts as an inverter transistor in the I²L circuit.

The injector transistor Q1 has base 2, emitter 4 and collector 6. Emitter 4 is connected to a first power supply terminal 8 through a constant current source 10. Base 2 is connected to second power supply terminal 12.

Figure 2:
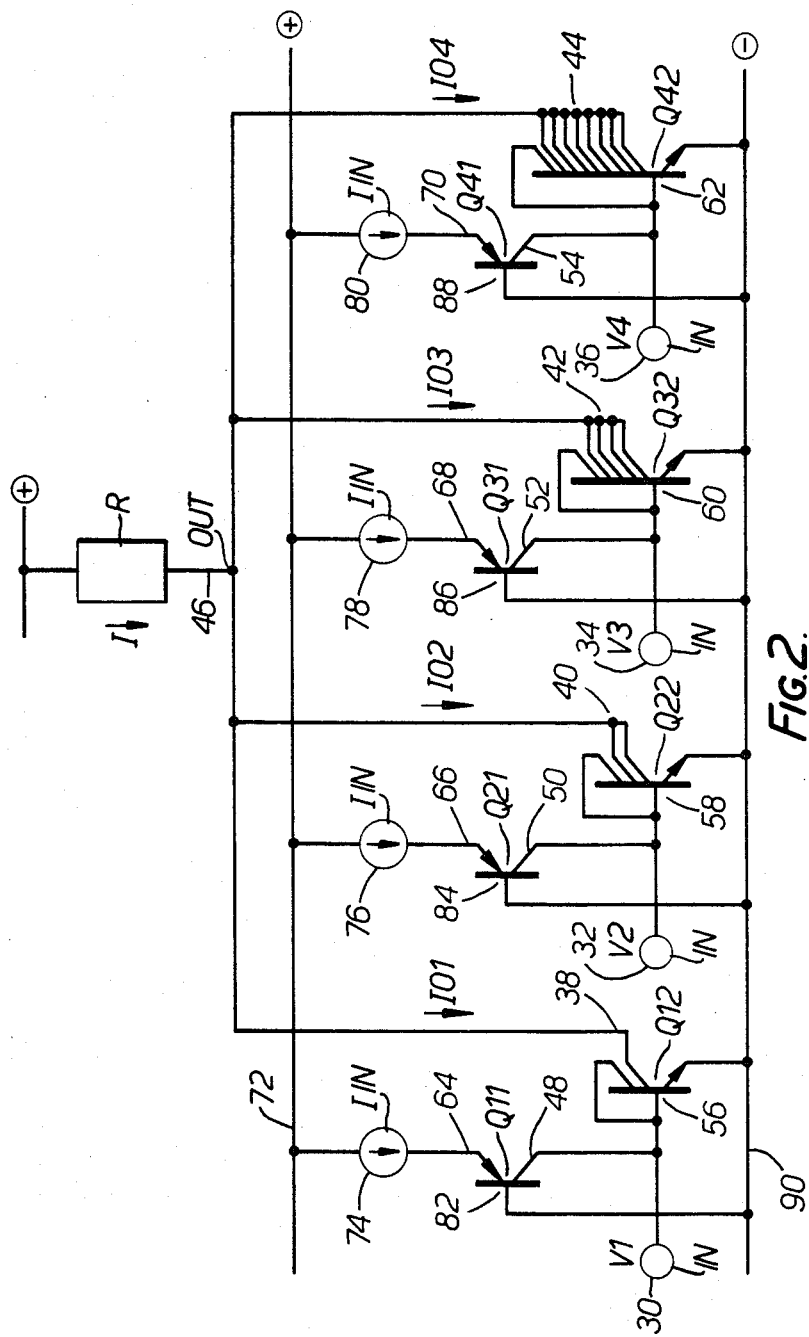
FIG. 2 shows a first preferred embodiment of the D/A converter of the present invention.

The inverter transistor Q2 has base 14, emitter 16, and a plurality of collectors 18. In the circuit of FIG. 2 the inverter transistor Q2 has three collector electrodes 18. One of the collector electrodes 18 of inverter transistor Q2 is connected to base 14. The remaining two collectors of electrode 18 are connected to output terminal 20 and are referred to as the output collector electrodes. The emitter 16 of injector transistor Q2 is connected to the second power supply terminal 12.

Assuming that equal current flows in each of the three collector electrodes 18 of inverter transistor Q2, the current at base electrode 14 of transistor Q2 can be expressed by the following equation:

$$\alpha_p \cdot I_{IN} = \left(1 + \frac{3}{\beta_n}\right) = I_c \quad (1)$$

wherein, $\alpha_p$: base common current gain of transistor Q1.
$I_{in}$: injector current, namely the current of constant current source 10.
$\beta_n$: emitter common current gain of inverter transistor Q2.
$I_c$: collector current of transistor Q2.

The output current $I_{OUT}$ of inverter transistor Q2 is:

$$I_{OUT} = 2I_c \quad (2)$$

Assuming that the base common current gain $\alpha_p = 1$ and the emitter common current gain $\beta_n =$ infinity, the collector current $I_c$ and the injector current $I_{IN}$ are equal. Therefore, the output current $I_{OUT}$ can be expressed by the following equation:

$$I_{OUT} = 2I_{IN} \quad (3)$$

In the I²L circuit of FIG. 1, the output current $I_{OUT}$ is determined and weighted in accordance with the number of output collector electrodes 18 of the inverter transistor Q2. The number of output collector electrodes for the inverter transistor Q2 of each stage of the D/A converter can be different thereby allowing for a different weighting of the signal applied to each stage. For instance, the first stage can have one output collector electrode 18, the second stage can have two output collector electrodes 18, the third stage can have four output collector electrodes 18, and the fourth stage can have eight output collector electrodes 18. Thus the output current $I_{OUT}$ is the summation of the individual outputs of each stage, i.e., $I_{IN} + 2I_{IN} + 4I_{IN} + 8I_{IN}$. In the above example of a four stage D/A converter, the output current $I_{OUT}$ is weighted in a binary sense.

Referring to FIG. 1, a binary signal can be applied to the input terminal 22. When a high level logic signal is applied to terminal 22, converter transistor Q2 conducts and output current $I_{OUT}$ appears at terminal 20. When the input voltage V is at a low level, the inverter transistor Q2 is cut off and no output current appears at terminal 20. Thus when multiple stages are connected together, each stage representing a separate bit of the input digital signal, the output signal will be an analog equivalent signal.

FIG. 2 shows a preferred embodiment of the present invention for processing a 4 bit digital input signal. The 4 bits are applied to the respective input terminals 30, 32, 34 and 36. Transistors Q12, Q22, Q32 and Q42 are the respective inverter transistors of the first, second, third and fourth stages of the D/A converter. Each respective transistor has two, three, five and nine collector electrodes 38, 40, 42 and 44. Since each of the inverter transistors Q12, Q22, Q32 and Q42 have a single collector electrode connected to its base, the number of output collector electrodes is 1, 2, 4 and 8 respectively for the four stages. These output collector electrodes 38, 40, 42 and 44 are all connected to output terminal 46.

Transistors Q11, Q21, Q31 and Q41 are respectively the injector transistors of the first, second, third and fourth stages. The collector electrodes 48, 50, 52 and 54 are connected to the respective base electrodes 56, 58, 60 and 62 of inverters Q12, Q22, Q32, and Q42. The emitter electrodes 64, 66, 68 and 70 of the respective injector transistors Q11, Q21, Q31 and Q41 are connected to the first power supply terminal 72 through respective current sources 74, 76, 78 and 80. Each constant current source is designed to supply a current $I_{IN}$ to each injector transistor. The base electrodes 82, 84, 86 and 88 of the respective injector transistors Q11, Q21, Q31 and Q41 are connected to the second power supply terminal 90.

The inverter transistors Q12, Q22, Q32 and Q42 are supplied with input digital signals V1, V2, V3 and V4 at their respective base electrodes. These input signals correspond to the bits of a 4 bit digital signal. In the D/A converter 2, the V4 signal is the most significant bit (MSB), V3 is the second most significant bit, V2 is the third most significant bit, and V1 is the least significant bit (LSB).

As described above, the number of output collector electrodes for each output inverter transistor Q11, Q21, Q31 and Q41 are 1, 2, 4 and 8 respectively. Consequently, the output current $I_{01}$ to $I_{04}$ of the respective transistors are weighted as follows:

$$I_{01} = I_{IN}$$

$$I_{02} = 2I_{IN}$$

$$I_{03} = 4I_{IN}$$

$$I_{04} = 8I_{IN} \quad (4)$$

The current I flowing through load R which is connected between output terminal 46 and the first power supply terminal 72, is the summation of the output currents $I_{01}$, $I_{02}$, $I_{03}$, and $I_{04}$ from inverter transistors Q12, Q22, Q32 and Q42. Thus the analog output current I can be expressed as follows:

$$I = a_1 \cdot I_{01} + a_2 \cdot I_{02} + a_3 \cdot I_{03} + a_4 \cdot I_{04} = (2^0 \cdot a_1 + 2^1 a_2 + 2^2 a_3 = 2^3 a_4) \cdot I_{IN} \quad (5)$$

Wherein coefficients $a_1$ and $a_4$ are determined according to the level of input digital signals $V_1$–$V_4$. For instance when digital signal $V_1$ is at a high level, $a_1$ is 1 and when $V_1$ is at a low level, $a_1$ is zero. This is likewise true for each of the other coefficients $a_2$, $a_3$ and $a_4$.

The output analog voltage $V_{OUT}$ generated at load R by the output current I can be expressed as follows:

$$V_{OUT} = (2^0 \cdot a_1 + 2^1 a_2 + 2^2 \cdot a_2 + 2^3 a_3) I_{IN} R \quad (6)$$

where R is the resistance value of load R.

It is clear then that the relationship between the digital input signal and analog output signal is shown in table 1 below.

TABLE 1

| DIGITAL INPUT | | | | ANALOG OUTPUT |
| --- | --- | --- | --- | --- |
| $a_4$ | $a_3$ | $a_2$ | $a_1$ | $V_{OUT}$ |
| 0 | 0 | 0 | 0 | 0 |
| 0 | 0 | 0 | 1 | 1 |
| 0 | 0 | 1 | 0 | 2 |
| 0 | 0 | 1 | 1 | 3 |
| 0 | 1 | 0 | 0 | 4 |
| 1 | 0 | 0 | 0 | 3 |
| 1 | 1 | 1 | 1 | 16 |

In Table 1 the analog output signal $V_{OUT}$ represents $I_{IN} \times R$ in equation 6 above. As shown in Table 1, the 4 bit D/A converter of FIG. 2 operates to convert the input signal to its analog equivalent.

It is possible to increase the number of bits to be processed by the D/A converter by increasing the number of I$_2$L circuit stages of FIG. 1. It is necessary to collect the number of output collector electrodes of the respective output inverter transistor of each I$_2$L circuit stage in accordance with the relative significance of the bit of the digital signal.

One disadvantage of using I$_2$L circuits is that the breakdown voltage of the output inverter transistor is normally only several volts.

Figure 3:
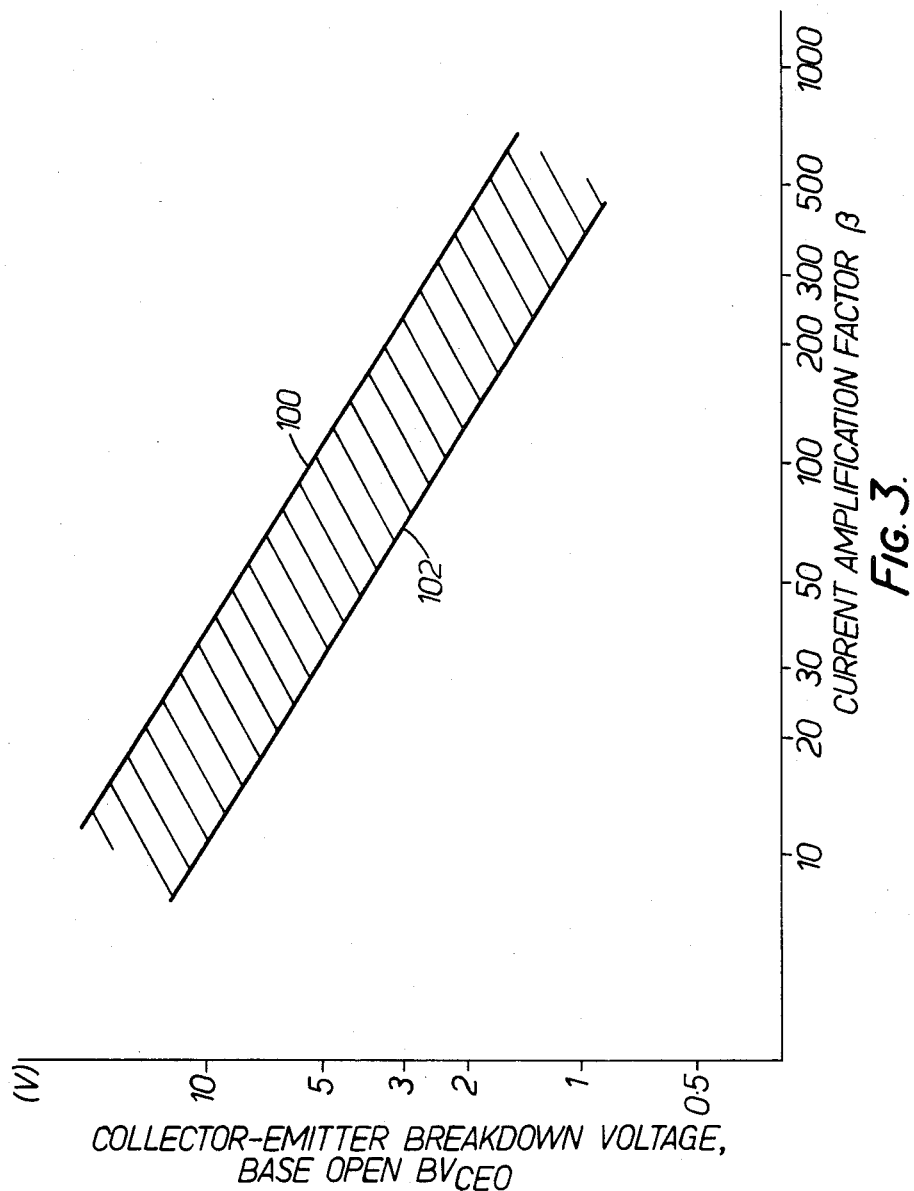
FIG. 3 shows the relationship between the collector-emitter breakdown voltage, base open, and the current amplification factor $\beta$.

The collector-emitter breakdown voltage (base open) $BV_{CEO}$ of the output transistor of an I$^2$L circuit varies inversely with the current amplification factor $\beta$ of the transistor. FIG. 3 shows the general relationship between the current amplification factor $\beta$ and the output withstand voltage $BV_{CEO}$ of the output transistor of the I$^2$L circuit. The lines 100 and 102 provide the approximate range of values of the current amplification factor for particular values of collector-emitter breakdown voltage $BV_{CEO}$. For example, if $\beta$ equals 10, then $BV_{CEO}$ is approximately 10 volts. If $\beta$ is an order of magnitude greater, i.e., 100, then $BV_{CEO}$ is approximately 2 volts. Since a conventional I$^2$L circuit is designed so that the output withstand voltage $BV_{CEO}$ is about 2 volts or lower, it is not possible to obtain an output signal with a large amplitude from such an I$^2$L circuit.

Figure 4:
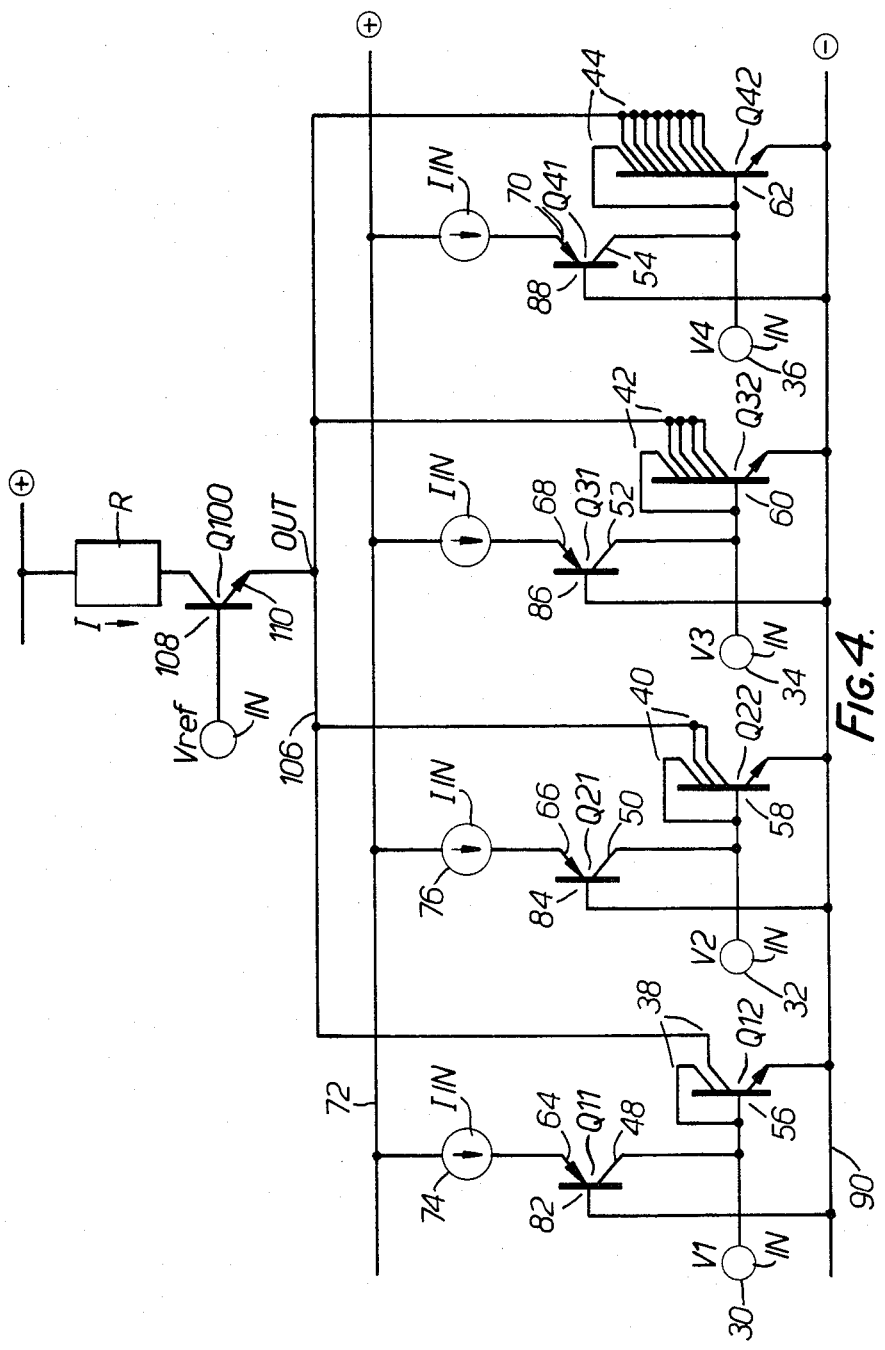
FIG. 4 shows a modified version of the embodiment shown in FIG. 3.

The embodiment shown in FIG. 4 overcomes the above problem. In the D/A converter of FIG. 4, an additional transistor Q100 is interposed between the output terminal 106 and the load R. Otherwise, this embodiment is substantially identical to that of FIG. 2.

Transistor Q100 is of a conventional transistor construction. Consequently, transistor Q100 has a higher breakdown voltage than the output transistors in the I$^2$L stages. A reference voltage $V_{ref}$ is applied to the base 108 of transistor Q100. $V_{ref}$ is typically 1.4 volts. By providing the reference voltage $V_{ref}$ to the base of transistor Q100, the emitter voltage of transistor Q100, i.e., the collector voltages of output transistors Q12, Q22, Q32 and Q42 are regulated. As a consequence, an output signal can be obtained having a large logical amplitude.

Figure 5:
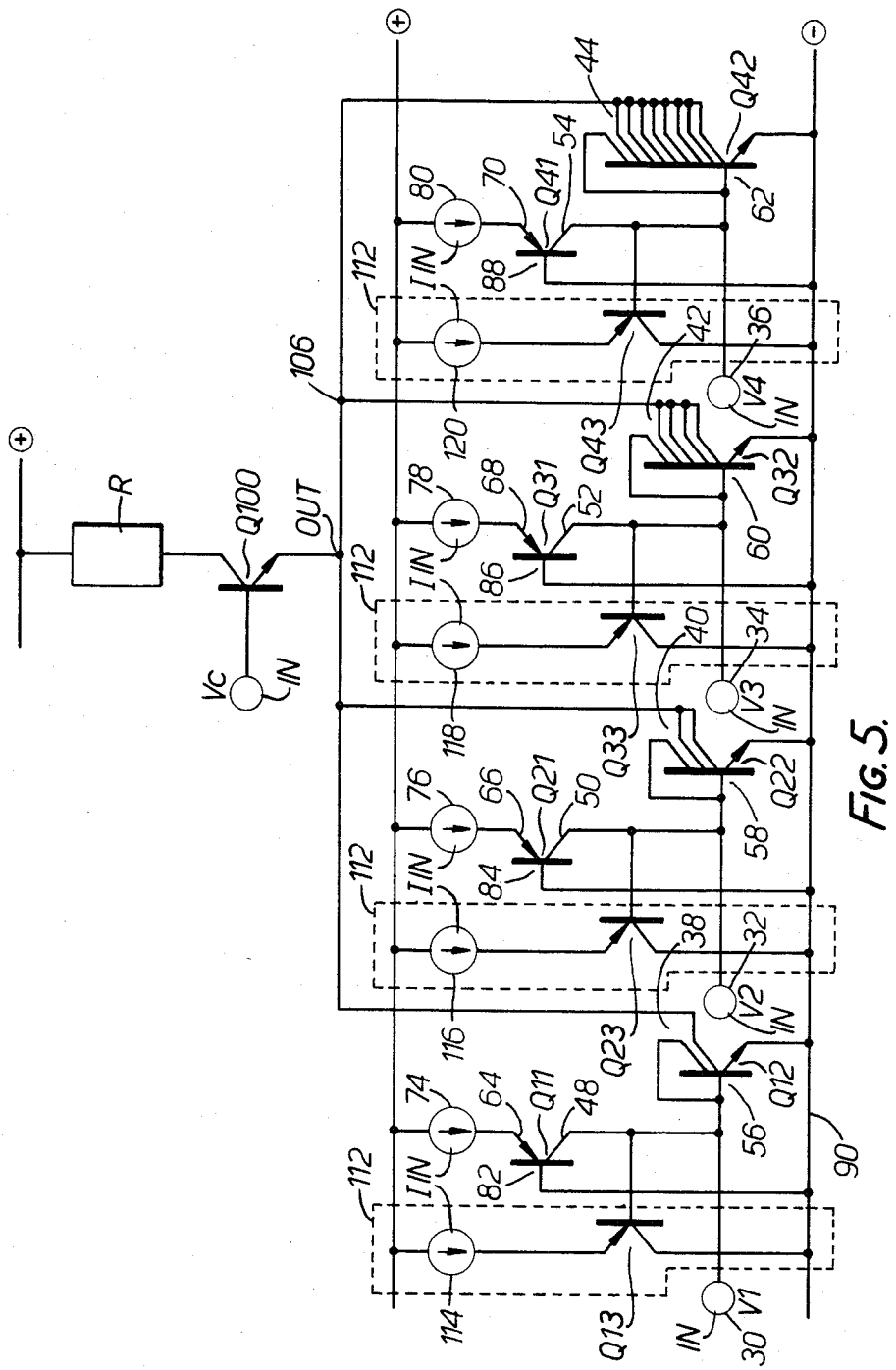
FIG. 5 shows a further modified embodiment of the present invention.

FIG. 5 shows still another preferred embodiment of the present invention. The D/A converter of FIG. 5 has four stages, each of which is equipped with an $\alpha$-adjusting circuit 112. The respective output adjusting circuits 112 include transistors Q13, Q23, Q33 and Q43.

Looking at the first stage, Q13 has its emitter connected through current source 114 to the power supply terminal 72 and its collector connected to the power supply terminal 90. The base of transistor Q13 is connected to collector 48 of transistor Q11. Each of transistors Q23, Q33 and Q43 are similarly connected in the second, third and fourth stages of the D/A converter of FIG. 5. Transistor Q23 has its emitter connected through constant current source 116 to terminal 72, its collector connected to power supply terminal 90 and its base connected to collector 50 of transistor Q21. Transistor Q33 has its emitter connected through constant current source 118 to power supply terminal 72, its collector connected to second power supply terminal 90 and its base connected to collector 52 of transistor 31. Finally transistor 43 has its emitter connected through constant current source 120 to power supply terminal 72, its collector connected to power supply terminal 90 and its base connected to collector 54 of transistor Q41.

The purpose of adjusting circuits 112 is to maintain the $\alpha$ of the injector transistors Q11 through Q41 substantially at 1.0. Because of the effect of the base current of each of the respective injector transistors, $\alpha$ normally is not maintained at 1.0. By adding the additional transistors Q13 through Q43 (assuming that the emitter current of the respective transistors Q13–Q43 is equal to that of the injector transistors Q11–Q41) an equal base current from the $\alpha$ adjusting transistors is added to the collector current of the respective injector transistors Q11 through Q41.

Therefore the base common current gain of the respective injector transistors Q11 through Q41 is adjusted and maintained at a value of 1.0.

Figure 6A:
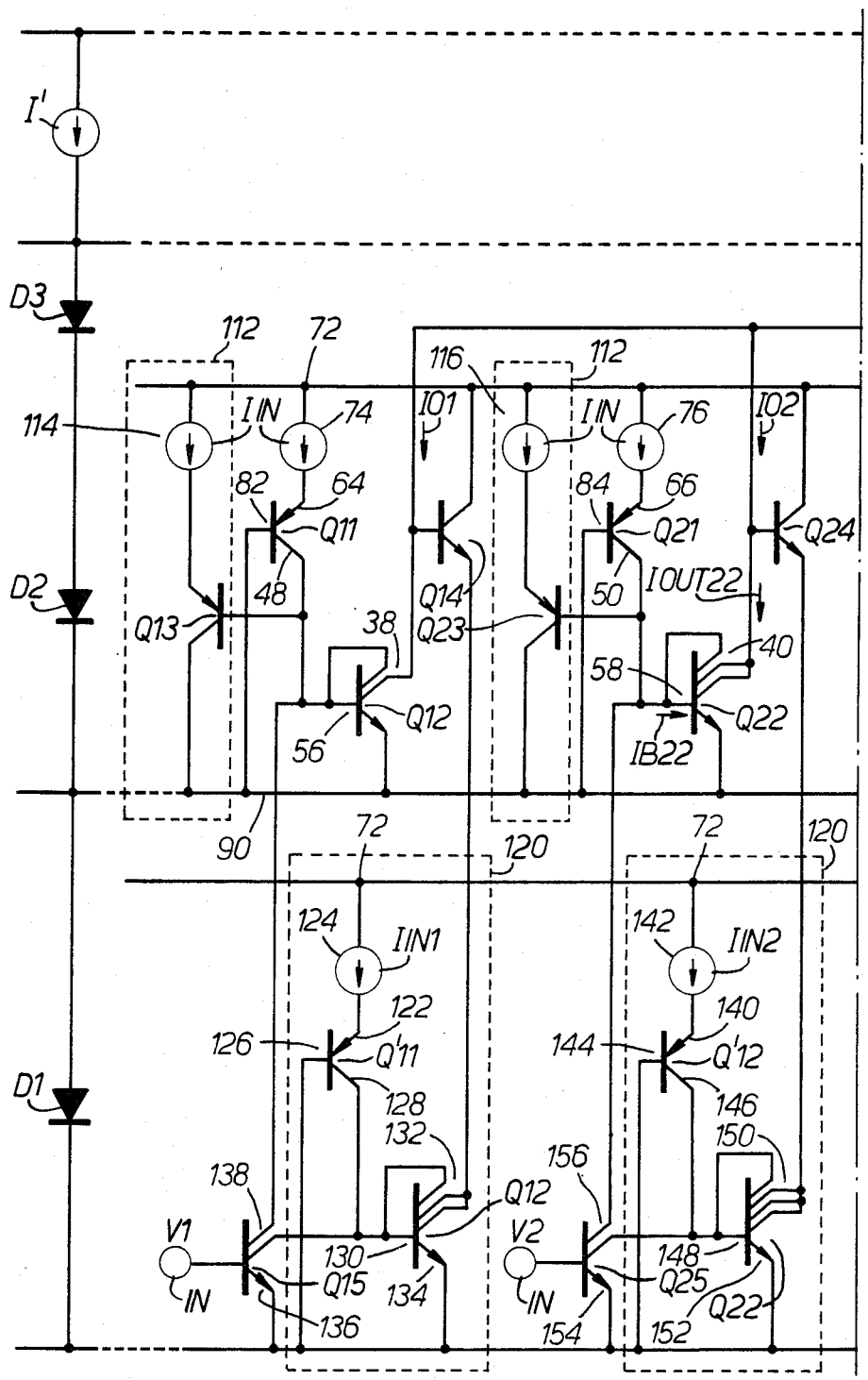
FIGS. 6A and 6B show yet another modified embodiment of the present invention.
Figure 6B:
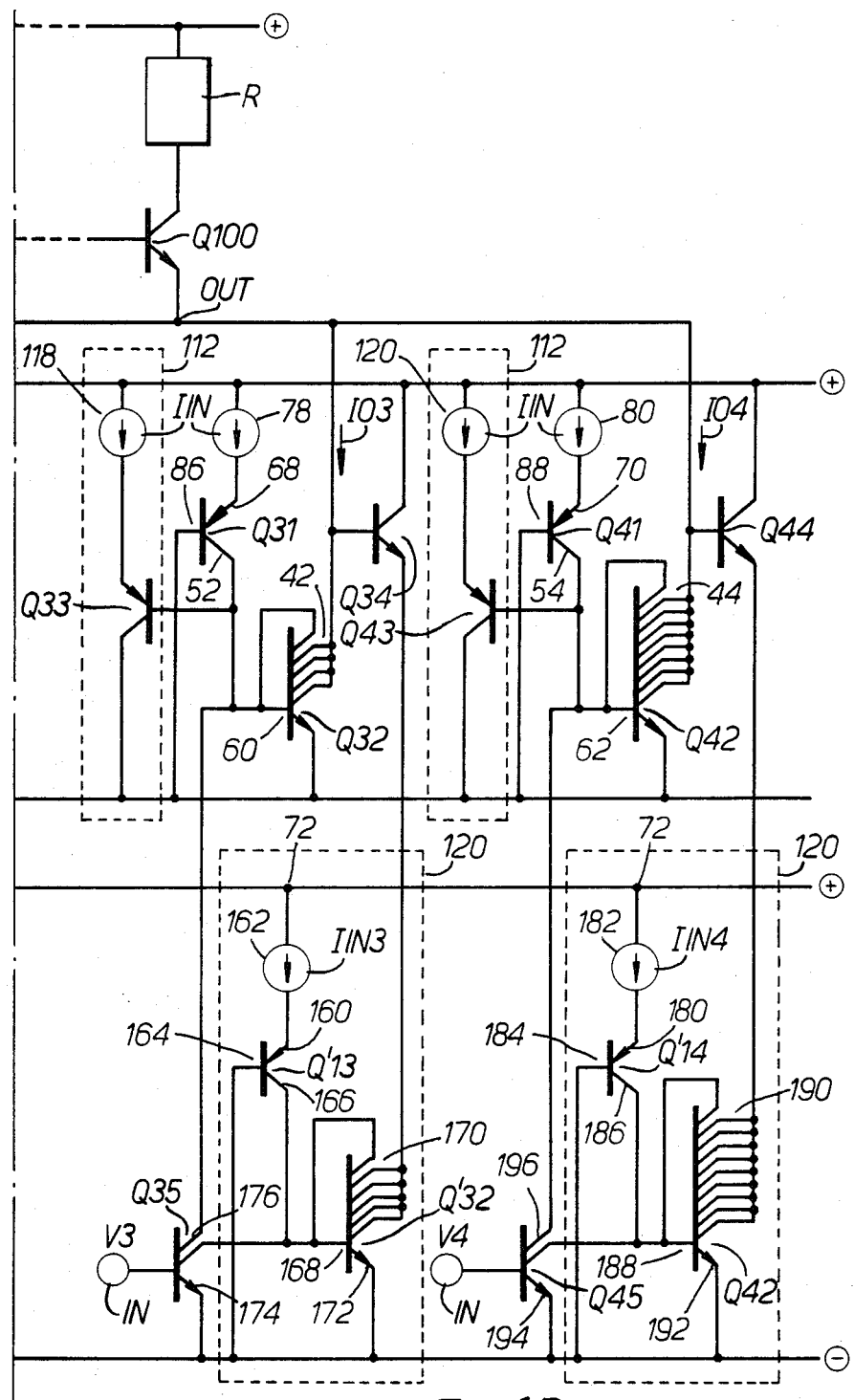

FIGS. 6A–6B shows yet another embodiment according to the present invention. This embodiment is substantially similar to that of FIG. 5, but is further modified to add a $\beta$ adjusting circuit 120 to each of the respective stages of the D/A converter. This embodiment also includes a bias circuit comprised of current source I′ and 3 diodes, D1, D2 and D3.

The $\beta$ adjusting circuits 120 for each of the respective stages are substantially identical. In the first stage, transistors Q11′ and Q12′ form an I²L circuit associated with inverter transistor Q12. Injector transistor Q11′ has its emitter 122 connected through constant current source 124 to a first power supply terminal 72, its base electrode 126 connected to a second power supply terminal 90 and its collector 128 connected to base 130 of transistor Q′12. The inverter transistor Q′12 has one of a plurality of collector electrodes 132 being connected to its base 130, its remaining output collector electrodes 132 connected to the emitter of transistor Q14 and its emitter 134 connected to power supply terminal 90. The output collector electrodes 132 of transistor Q′12 are effectively connected to the output collectors 38 of transistor Q12 of inverter transistor Q12 through the emitter-base circuit of transistor Q14.

It should be noted that the inverter transistor Q′12 has one more output collector electrode 132 than the corresponding output transistor Q12 of stage 1 of the D/A converter. This is also true for the inverter transistors Q′22, Q′32 and Q′42 with respect to the corresponding inverter transistors Q22, Q32 and Q42 in the second, third and fourth stages.

The input to the first stage is through transistor Q15 which has emitter 136 connected to power supply terminal 90 and respective collector electrodes connected to base 56 of transistor Q12 and base 130 of transistor Q′12.

As will now be described, each of the succeeding $\beta$-adjusting circuits 120 are similarly connected to the respective stages of the D/A converter. In the second stage, $\beta$-adjusting circuit 120 comprised of transistors Q′12 and Q′22 are connected in an I²L circuit associated with the output transistor Q22. Injector transistor Q′12 has emitter 140 connected through constant current source 142 to the first power supply terminal 72, base 144 connected to second power supply terminal 90 and collector 146 connected to base 148 of inverter transistor Q′22. Transistor Q′22 has a plurality of collectors 150, one of which is connected to base 148 and the remaining output collectors 150 are connected to the inverter transistor Q22 through transistor Q24. Emitter electrode 152 of inverter transistor Q′22 is connected to the power supply terminal 90. The input to the second stage is through transistor Q25 having an emitter 154 connected to power supply terminal 90 and respective collector electrodes 156 connected to the base 58 of transistor Q22 and base 148 of transistor Q′22.

The third stage of the D/A converter has $\beta$-adjusting circuit 120 comprised of injector transistor Q13′ and inverter transistor Q32′ connected in an I²L circuit. Injector transistor Q′13 has emitter 160 connected through constant current source 162 to a first power supply terminal 72, base 164 connected to a second power supply terminal 90 and collector 166 connected to base 168 of transistor Q′32. The inverter transistor Q′32 has a plurality of collectors 170 one of which is connected to base 168 and the remaining output collectors 170 are connected to inverter transistor Q32 through transistor Q34. Inverter transistor Q′32 further has emitter 172 connected to the second power supply terminal 90. The input to the third stage is through transistor Q35 having emitter 174 connected to power supply terminal 90 and respective collectors 176 connected to base 60 of transistor Q32 and base 168 of transistor Q′32.

Finally, the $\beta$-adjusting circuit 120 of the fourth stage is comprised of injector transistor Q′14 and inverter transistor Q′42 connected in an I²L circuit arrangement. Injector transistor Q′14 has emitter 180 connected through constant current source 182 to first power supply terminal 72, base 184 connected to second power supply source 90 and collector 186 connected to base 188 of inverter transistor Q′42. The inverter transistor Q′42 has a plurality of collector electrodes 190, one of which is connected to base 188 and the remaining output collectors are connected to inverter transistor Q42 through transistor Q44. Inverter transistor Q′42 further includes an emitter 192 connected to power supply terminal 90. The input signal is applied to the fourth stage through transistor Q45 which has an emitter 194 connected to power supply terminal 90 and respective collectors 196 connected to base 62 of transistor Q42 and base 188 of transistor Q′42.

The digital input signals V1, V2, V3 and V4 are applied through the respective base electrodes of input transistors Q15, Q25, Q35 and Q45. In this circuit, the output current is the sum of the collector currents of output transistors Q12 through Q42 and the base currents of transistors Q14 through Q44.

For example, referring to the second stage of the D/A converter of FIG. 6, the base current $I_{B22}$ supplied to transistor Q22 is:

$$I_{B22} = \alpha_{21}I_{IN} + (1-\alpha_{22})I_{IN} - I_{C22} = (1+\alpha_{21}-\alpha_{22})I_{IN} - I_{C22} \quad (7)$$

wherein $\alpha_{21}$, $\alpha_{22}$ are the base common current gain respectively for transistors $Q_{21}$ and $Q_{22}$;

$I_{C22}$ is the collector current of transistor $Q_{22}$.

Assuming that $\alpha_{21}$ equals $\alpha_{22}$, equation (7) can be rewritten as:

$$I_{B22} = I_{IN} - I_{C22} \quad (8)$$

$$= \frac{1}{22} \cdot 3 I_{C22}$$

wherein $\beta_{22}$ is the emitter common current gain of transistor $Q_{22}$.

As described above, equation (8) shows that by the addition of transistor $Q_{23}$, the $\alpha$ adjustment for injector transistor $Q_{21}$ is effected to maintain $\alpha$ constant. From equation (8), $I_{C22}$ can be calculated as follows:

$$I_{C22} = \frac{I_{IN}}{1 + \frac{3}{\beta_{22}}} \quad (9)$$

$$\approx \left(1 - \frac{3}{\beta_{22}}\right) I_{IN}$$

So the output current $I_{OUT\,22}$ of transistor $Q_{22}$ is:

$$I_{OUT\,22} = 2 \cdot I_{C22} \quad (10)$$

$$= 2\left(1 - \frac{3}{\beta_{22}}\right) I_{IN}$$

However, the emitter current $I_{e24}$ of transistor $Q_{24}$ is $$I_{e24} = 3 I_{C22'} \quad (11)$$

$$= 3 \frac{\alpha_{12'} I_{IN2}}{1 + \frac{4}{\beta_{22'}}}$$

Wherein, $\alpha'_{12}$ is the base common current gain of transistor $Q'_{12}$; $\beta_{22}'$ is the emitter common current gain of transistor $Q'_{22}$; $I_{C22}$ is the collector current of transistor $Q'_{22}$; and $I_{IN2}$ is the current of current source $I_{IN2}$.

Assuming that the gain $_{12'}$ is 1.0, equation (11) can be rewritten as follows:

$$I_{e24} = 3 \frac{I_{IN2}}{1 + \frac{4}{\beta_{22}'}} \quad (12)$$

$$= 3\left(1 - \frac{4}{\beta_{22}'}\right) I_{IN2}$$

Further assuming that the base common current gain $\alpha_{24}$ of transistor $Q_{24}$ is 1.0, the collector current $I_{C24}$ of transistor $Q_{24}$ is equal to the emitter current $I_{e24}$. Therefore the base current $I_{e24}$ of transistor $Q_{24}$ can be expressed as follows:

$$I_{B24} = \frac{I_{C24}}{\beta_{24}} \quad (13)$$

$$= 3\left(\frac{1}{\beta_{24}} - \frac{4}{\beta_{24}\beta'_{22}}\right) I_{IN2}$$

$$\approx 3 \frac{I_{IN2}}{\beta_{24}}$$

wherein $\beta_{24}$ is the emitter common current gain of transistor $Q_{24}$.

Therefore the output current $I_{OUT2}$ is expressed as follows:

$$I_{OUT2} = I_{OUT22} + I_{B24} \quad (14)$$

$$= 2\left(1 - \frac{3}{\beta_{22}}\right) I_{IN} + 3 \frac{I_{IN2}}{\beta_{24}}$$

$$= 2 I_{IN} - \left(\frac{6}{\beta_{22}} I_{IN} - \frac{3 I_{IN2}}{\beta_{24}}\right)$$

Assuming that $\beta_{22}$ equals $\beta_{24}$ and $I_{IN2}$ equals $2 \times I_{IN}$, equation (13) can be reduced to the following expression:

$$I_{OUT} = 2 I_{IN} \quad (15)$$

It is apparent from the above discussion that the embodiment of FIGS. 6A–6B makes the necessary $\alpha$ and $\beta$ adjustments to achieve a correct and stable output for the D/A converter. It should be noted that in this embodiment, the number of output collector electrodes of the respective transistors $Q_{12}'$, $Q_{22}'$, $Q_{32}'$ and $Q_{42}'$ are selected to be 2, 3, 5 and 9 so that the constant current sources $I_{N1}$, $I_{N2}$, $I_{N3}$ and $I_{N4}$ have respective currents of $I_N$, $2I_N$, $4I_N$ and $8I_N$.

Thus one skilled in the art, understanding the above disclosed and described invention, could develop variations on the invention without departing from the spirit and scope of the invention and should not be limited to the specific embodiments described.

What is claimed is:

1. A digital-to-analog converter which converts an input digital signal consisting of a plurality of bits into an analog output signal comprising:

a plurality of stages equal in number to the number of bits of said input digital signal, each stage having an input terminal and an output terminal respectively, including:

(a) a first transistor having a base, an emitter, and a plurality of collector electrodes, one of said collector electrodes being connected to said base electrode, the remaining collector electrodes being connected to said output terminal, and the base electrode being connected to said input terminal, (b) a first reference voltage source connected to the emitter electrode of said first transistor, (c) current means including a first current source and a second transistor having a base electrode connected to the emitter electrode of said first transistor, a collector electrode connected to the base electrode of said first transistor, and an emitter electrode connected to said first current source, and (d) an α-adjusting circuit including a second current source and a third transistor having a base electrode connected to the collector electrode of said second transistor, a collector electrode connected to the emitter electrode of said first transistor, and an emitter electrode connected to the second current source, each of said bits of said input signal being applied to a respective input terminal of said plurality of stages and the respective output terminals of said stages being connected together to produce said analog output signal.

2. The digital-to-analog converter according to claim 1 wherein said first and second current sources generate the same current.

3. The digital-to-analog converter according to claim 2 in which each stage further comprises a β-adjusting circuit which includes:

(a) a fourth transistor having a base electrode connected to said input terminal, an emitter electrode and a plurality of collector electrodes, one of said collector electrodes being connected to the base electrode of said fourth transistor, (b) a second reference voltage source connected to the emitter electrode of said fourth transistor, (c) a constant current source connected to the base electrode of said fourth transistor, (d) a fifth transistor having a base electrode connected to said output terminal, an emitter electrode connected to the remaining collector electrodes of said fourth transistor, and (e) a third reference voltage connected to the collector electrode of said fifth transistor.

* * * * *